United States Patent
Reznicek et al.

(10) Patent No.: US 11,404,581 B2
(45) Date of Patent: Aug. 2, 2022

(54) WIMPY VERTICAL TRANSPORT FIELD EFFECT TRANSISTOR WITH DIPOLE LINERS

(71) Applicant: INTERNATIONAL BUSINESS MACHINES CORPORATION, Armonk, NY (US)

(72) Inventors: Alexander Reznicek, Troy, NY (US); Xin Miao, Slingerlands, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/128,257

(22) Filed: Dec. 21, 2020

(65) Prior Publication Data
US 2022/0199834 A1 Jun. 23, 2022

(51) Int. Cl.
*H01L 29/06* (2006.01)
*H01L 29/66* (2006.01)
(Continued)

(52) U.S. Cl.
CPC .... *H01L 29/78618* (2013.01); *H01L 29/6656* (2013.01); *H01L 29/66666* (2013.01); *H01L 29/7788* (2013.01)

(58) Field of Classification Search
CPC ....... H01L 21/28141; H01L 21/823487; H01L 21/823885; H01L 29/0653; H01L 29/0676; H01L 29/66553; H01L 29/6656; H01L 29/66666; H01L 29/7827; H01L 29/78618; H01L 29/78642; H01L 29/7788
See application file for complete search history.

(56) References Cited

U.S. PATENT DOCUMENTS

| 6,475,866 B2 | 11/2002 | Hofmann |
| 9,711,618 B1 * | 7/2017 | Cheng ............... H01L 29/66545 |

(Continued)

FOREIGN PATENT DOCUMENTS

KR 101026484 B1 6/2009

OTHER PUBLICATIONS

Kita et al., "Intrinsic Origin of Electric Dipoles Formed at High-k/SiO2 Interface", IEDM 2008, 4 pages.
(Continued)

*Primary Examiner* — David C Spalla
(74) *Attorney, Agent, or Firm* — L. Jeffrey Kelly (57) ABSTRACT

A semiconductor structure may include a bottom source drain, a top source drain, a gate stack. The top source drain is above the gate stack and the bottom source drain is below the gate stack. The semiconductor structure may also include a bottom spacer and a top spacer. The gate stack is between the bottom spacer and the top spacer. The bottom spacer and the top spacer each comprise a dipole liner. The dipole liner includes a first layer and a second layer. The second layer may be in direct contact with the first layer. The second layer may be made of different material than the first layer. The first layer may be made of silicon oxide. The second layer may be made of silicon nitride or aluminum oxide. The first layer may be in direct contact with the gate stack, the top source drain, and the bottom source drain.

19 Claims, 8 Drawing Sheets

(51) Int. Cl.
  *H01L 29/78* (2006.01)
  *H01L 29/786* (2006.01)
  *H01L 29/778* (2006.01)

(56) References Cited

U.S. PATENT DOCUMENTS

| | | |
|---|---|---|
| 9,799,749 B1 | 10/2017 | Bi |
| 9,954,103 B1 | 4/2018 | Gluschenkov |
| 9,960,271 B1 | 5/2018 | Xie |
| 9,991,365 B1 | 6/2018 | Cheng |
| 10,002,791 B1 | 6/2018 | Bao |
| 10,043,878 B2 | 8/2018 | Balakrishnan |
| 10,573,723 B1 | 2/2020 | Ando |
| 2015/0380548 A1 | 12/2015 | Wang |
| 2018/0053848 A1 | 2/2018 | Balakrishnan |
| 2018/0212040 A1* | 7/2018 | Bao ................ H01L 29/66666 |
| 2018/0315834 A1 | 11/2018 | Cheng |
| 2019/0157161 A1* | 5/2019 | Balakrishnan ...... H01L 29/1066 |
| 2020/0357894 A1 | 11/2020 | Cheng |

OTHER PUBLICATIONS

Litta et al., "Integration of TmSiO/HfO2 Dielectric Stack in Sub-nm EOT High-k/Metal Gate CMOS Technology", IEEE Transactions On Electron Devices, vol. 62, No. 3, Mar. 2015, pp. 934-939.

Litta et al., "Threshold voltage control in TmSiO/HfO high-k/metal gate MOSFETs", NASA/ADS, Solid State Electronics, vol. 108, p. 24-29, Pub. Date: Jun. 2015, 2 pages.

Notification of Transmittal of the International Search Report and the Written Opinion of the International Searching Authority, or the Declaration, dated Feb. 10, 2022, Applicant's or agent's file reference PF210875PCT, International application No. PCT/CN2021/130347, 9 pages.

* cited by examiner

WIMPY VERTICAL TRANSPORT FIELD EFFECT TRANSISTOR WITH DIPOLE LINERS

BACKGROUND

The present invention relates generally to a semiconductor structure and a method of forming the same. More particularly, the present invention relates to a semiconductor structure that includes a wimpy vertical transport field effect transistor with dipole liners.

Devices in non-critical circuit paths are preferred to have larger threshold voltages than standard devices. This assists in maintaining low leakage rates while not compromising circuit performance. These devices with larger threshold voltages are called 'wimpy' devices. Conventionally, wimpy devices are made with larger gate lengths and have higher channel doping than the standard devices. Wimpy devices, in non-critical circuit paths, reduce chip power consumption.

SUMMARY

According to one embodiment of the present invention, a semiconductor structure is provided. The semiconductor structure may include a bottom source drain, a top source drain, a gate stack. The top source drain is above the gate stack and the bottom source drain is below the gate stack. The semiconductor structure may also include a bottom spacer and a top spacer. The gate stack is between the bottom spacer and the top spacer. The bottom spacer and the top spacer each comprise a dipole liner. The dipole liner includes a first layer and a second layer. The second layer may be in direct contact with the first layer. The second layer may be made of different material than the first layer. The first layer may be made of silicon oxide. The second layer may be made of silicon nitride or aluminum oxide. The first layer may be in direct contact with the gate stack, the top source drain, and the bottom source drain. The bottom spacer may include a dielectric. The dielectric may be in direct contact with the dipole liner.

According to another embodiment of the present invention, a semiconductor structure is provided. The semiconductor structure may include a vertical field effect transistor including a top source drain, a bottom source drain, a bottom spacer, a top spacer, a gate stack. The bottom source drain is separated from the gate stack by the bottom spacer. The bottom spacer may include a dipole liner contacting the bottom source drain. The top source drain may be separated from the gate stack by the top spacer. The top spacer may include the dipole liner. The dipole liner may contact the top source drain. The dipole liner may include a first layer and a second layer. The second layer may be in direct contact with the first layer. the second layer may be made of different material than the first layer. The first layer may be made of silicon oxide. The second layer may be made of silicon nitride or aluminum oxide. The first layer may be in direct contact with the gate stack, the top source drain, and the bottom source drain. The bottom spacer may include a dielectric. The dielectric may be in direct contact with the dipole liner.

According to another embodiment of the present invention, a method is provided. The method may include forming a bottom source drain on a substrate, forming a bottom spacer, wherein the bottom spacer may be in direct contact with the bottom source drain, wherein the bottom spacer may include a dipole liner, forming a gate stack above the bottom spacer, forming a top spacer above the gate stack, wherein the top spacer may be in direct contact with the gate stack, wherein the top spacer may include the dipole liner, and forming a top source drain above the top spacer. The dipole liner may include a first layer and a second layer. The second layer may be in direct contact with the first layer. The second layer may be made of different material than the first layer. The first layer may be in direct contact with the gate stack, the top source drain, and the bottom source drain. The first layer may be made of silicon oxide. The second layer may be made of silicon nitride or aluminum oxide. The bottom spacer may include a dielectric. The dielectric may be in direct contact with the dipole liner.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that may include a wimpy vertical transport field effect transistor with a dipole liner. The vertical transport field effect transistor is referred to herein after as a vertical transistor.

Wimpy devices may be used in non-critical circuit paths to reduce chip power consumption. Conventionally, wimpy devices are made with larger gate lengths and have higher channel doping than the standard devices. For lateral field effect transistors, wimpy devices have 3-4 nm longer gate length than nominal devices, translating to the wimpy devices having about 20 mV higher threshold voltage. However, for vertical field effect transistors, it is difficult to make standard and wimpy devices having different gate lengths. Making vertical transistors having different gate lengths side by side leads to topography issues since the wimpy vertical transistor is shorter than the standard vertical transistor. As such, there exists a need for a method and a structure for fabricating wimpy vertical transistors that can be easily inserted into the normal process of record flow to form wimpy and standard vertical transistors side by side.

Embodiments of the present invention propose a method and a structure for fabricating wimpy vertical transistors by having spacer materials with dipole liners. To form a wimpy vertical transistor, embodiments of the present invention propose forming a bi-layer dipole liner along the channel where bottom and top spacers are located. The bi-layer dipole liner becomes a part of the respective bottom and top spacers. The resultant vertical transistors with the dipole liners are wimpy due to longer effective gate length and lower voltage leakage. Embodiments of the present invention use the dipole liners to change the electric field near the source drain regions of the vertical transistors to change the threshold voltage in a small range.

FIGS. 1-14 illustrate exemplary semiconductor structure that includes a wimpy vertical transistor with dipole liners.

Figure 1:
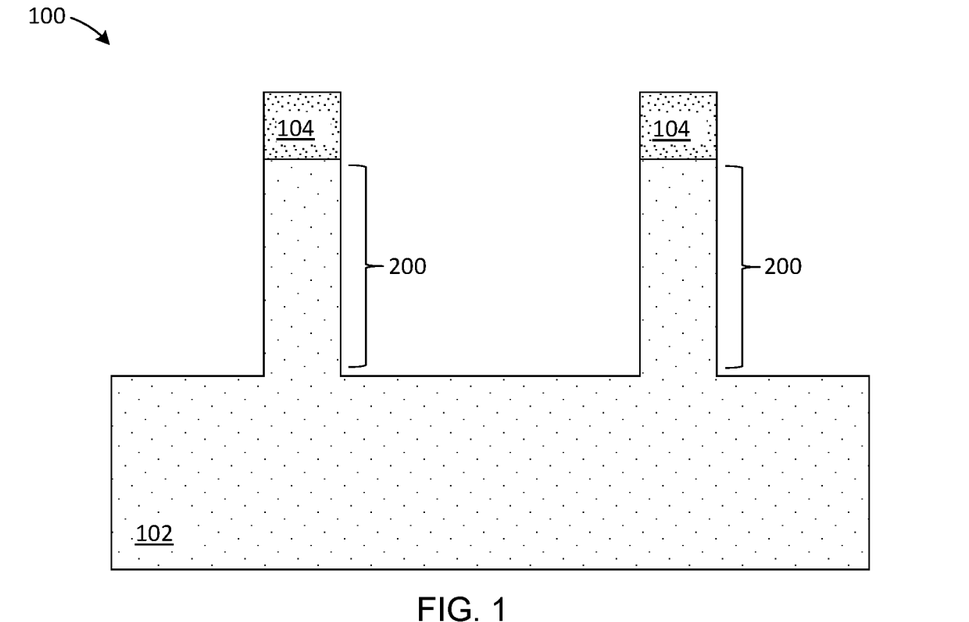
FIG. 1 is a cross section view illustrating forming vertical fins on a substrate in accordance with an exemplary embodiment.

Referring now to FIG. 1, a structure 100 is shown, in accordance with an embodiment. The structure 100 may include a substrate 102, a hard mask cap 104, and fins 200. The substrate 102 may include one or more semiconductor materials. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In an embodiment, the substrate 102 may include silicon. In one embodiment, the substrate 102 is a bulk semiconductor substrate. The term "bulk semiconductor substrate" denotes a substrate that is composed entirely of one or more semiconductor materials. In one example, the bulk semiconductor substrate is composed entirely of silicon.

A hard mask layer (not shown) may be deposited on a top surface of the substrate 102. The hard mask layer may include any dielectric material such as, for example, silicon dioxide, silicon nitride and/or silicon oxynitride. In some embodiments, the hard mask layer can be formed utilizing a conventional deposition process such as, for example, chemical vapor deposition, plasma enhanced chemical vapor deposition, physical vapor deposition, or atomic layer deposition. In other embodiments, the hard mask layer may be formed utilizing a thermal growth process such as, for example, thermal oxidation. In yet other embodiments, the hard mask layer can be formed by a combination of a deposition process and a thermal growth process. The hard mask layer may have a thickness ranging from approximately 10 nm to approximately 25 nm. Other thicknesses for the hard mask layer are possible and can be used in the present application.

After forming the hard mask layer on the top surface of the substrate 102, the hard mask layer and the substrate 102 are patterned (not shown). Patterning may be performed by lithography and etching. The patterning of the hard mask layer and the substrate 102 results in the formation of the hard mask cap 104 and the fins 200. The remaining portion, i.e., non-etched portion, of the hard mask layer is referred herein as the hard mask cap 104. The fins 200 each include a pair of vertical sidewalls that are parallel or substantially parallel to each other. Although two fins 200 are described and illustrated as being formed, a single fin 200 or a plurality of fins 200 may be formed. Each fin 200 may have a vertical height ranging from approximately 20 nm to approximately 150 nm, a width from 5 nm to 30 nm, and a length from 20 nm to 300 nm. Other vertical heights and/or widths and/or lengths that are lesser than, or greater than, the ranges mentioned herein can also be used in the present application.

Figure 2:
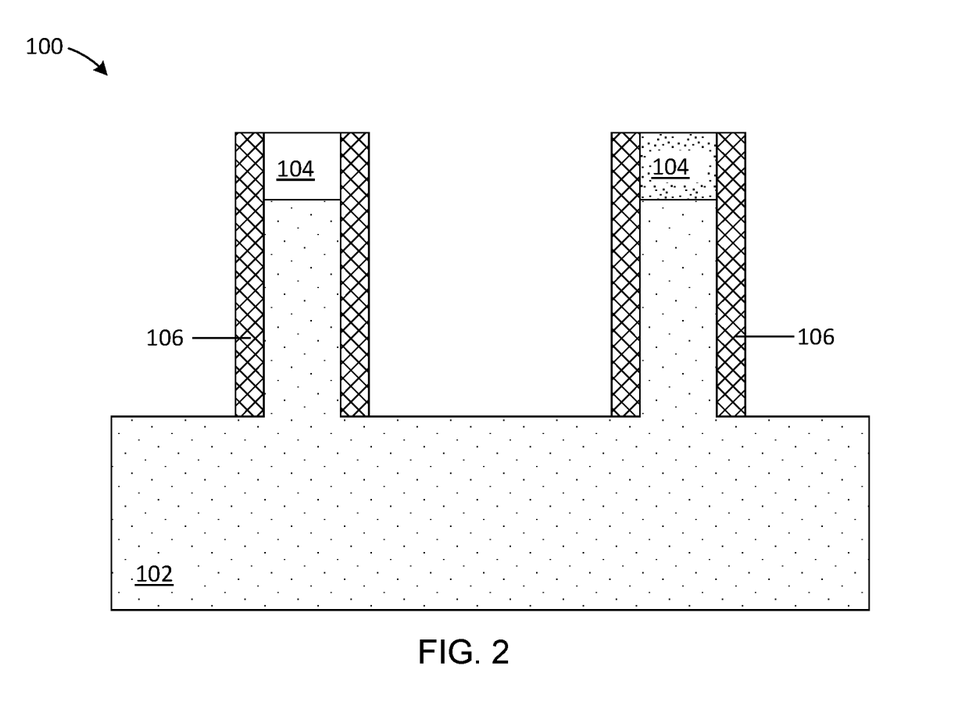
FIG. 2 is a cross section view illustrating forming spacers along the vertical sidewalls of the fins in accordance with an exemplary embodiment.

Referring now to FIG. 2, the structure 100 with a sidewall spacer 106 is shown, in accordance with an embodiment. A spacer layer (not shown) is first conformally deposited onto the top surfaces of the substrate 102 and the hard mask cap 104 as well as the sidewalls of the fins 200 and the sidewalls of the hard mask cap 104. The spacer layer may include an insulating material, such as, for example, silicon dioxide, silicon nitride, SiOCN, or SiBCN. Other non-limiting examples of materials for the spacer layer may include dielectric oxides (e.g., silicon oxide), dielectric nitrides (e.g., silicon nitride), dielectric oxynitrides, or any combination thereof. The spacer layer may be deposited by a deposition process, for example, atomic layer deposition, chemical vapor deposition, or physical vapor deposition. The spacer layer may each have a thickness ranging from approximately 3 to approximately 15 nm, or from approximately 5 to approximately 8 nm.

Once conformally deposited, the spacer layer is then etched back to form sidewall spacers 106. To form the sidewall spacers 106, the spacer layer may be etched by a dry etch process, for example, a reactive ion etch process, such that the spacer layer remains on the sidewalls of the hard mask cap 104 and the sidewalls of the fins 200 but is removed from the top surface of the substrate 102 and the top surface of the hard mask cap 104. The sidewall spacers 106 are positioned along the sidewalls of the fins 200 and the sidewalls of the hard mask cap 104. The sidewall spacers 106 protect the sidewalls of the fins 200 from damage during subsequent manufacturing processes.

Figure 3:
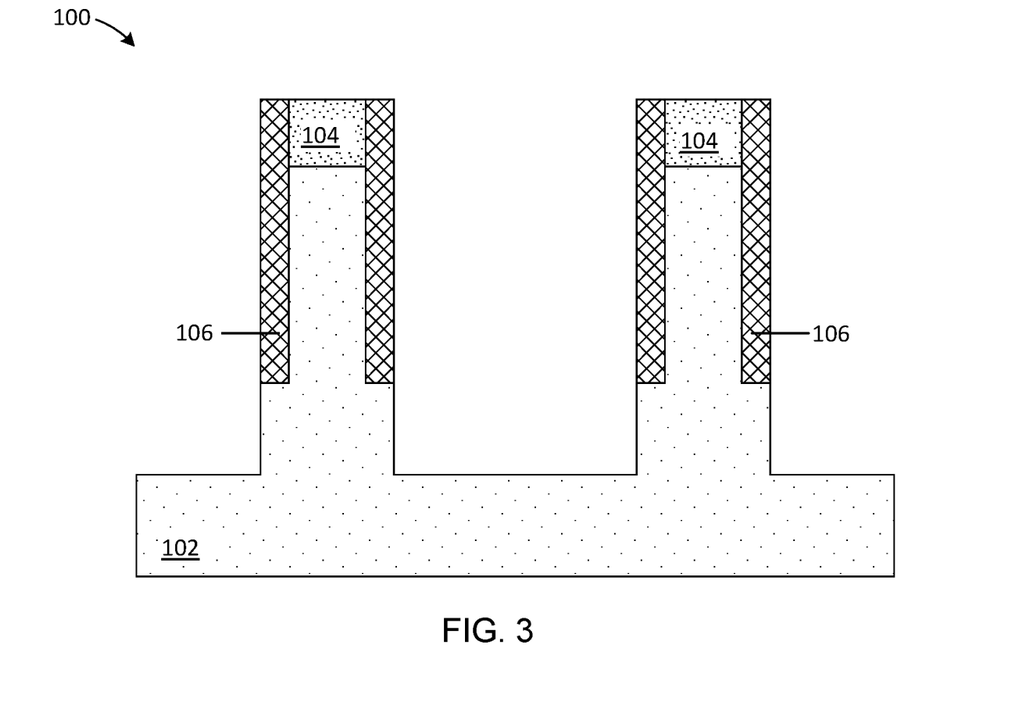
FIG. 3 is a cross section view illustrating recessing the substrate in accordance with an exemplary embodiment.

Referring now to FIG. 3, the structure 100 with the substrate 102 further recessed is shown, in accordance with an embodiment. Once the sidewall spacers 106 are formed, another etch process that is selective to (will not substantially remove) the sidewall spacers 106 or the hard mask cap 104 may be used to further recess the substrate 102. The etch process may be, for example, a dry anisotropic etch process. Recessing the substrate 102 exposes sidewalls of the substrate 102 directly below the sidewall spacers 106. Having the sidewall spacers 106 around the fins 200 during the etch process produces a wider bottom portion of the substrate 102 that is directly below the fins 200 when compared to the width of the fins 200 themselves.

Figure 4:
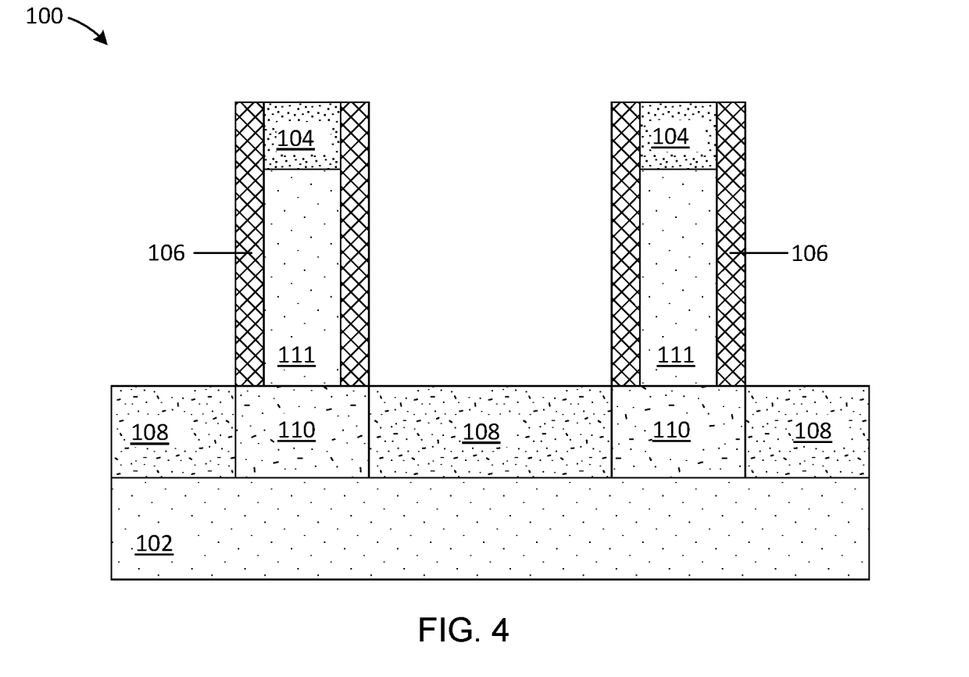
FIG. 4 is a cross section view illustrating forming a bottom source drain in accordance with an exemplary embodiment.

Referring now to FIG. 4, the structure 100 with a source drain epitaxy 108 and a bottom source drain 110 is shown, in accordance with an embodiment. Once the substrate 102 is further etched back to expose its sidewalls, the source drain epitaxy 108 is grown on top of the substrate 102. The source drain epitaxy 108 may be grown to a thickness such that the top surface of the source drain epitaxy 108 is substantially flush with the bottom surface of the spacers 106. The source drain epitaxy 108 may be made of silicon or silicon-germanium and in-situ doped. In an embodiment, the source drain epitaxy 108 may be heavily doped with a dopant, which may be a p-type dopant (e.g., boron or gallium). In an alternative embodiment, the source drain epitaxy 108 may be heavily doped with a dopant, which may be an n-type dopant (e.g., antimony, arsenic or phosphorous).

Once the source drain epitaxy 108 is deposited, the structure 100 undergoes a drive in anneal process to move some of the dopants from the source drain epitaxy 108 to a portion of the substrate 102 that is underneath the fins 200. Moving some of the dopants from the source drain epitaxy 108 to the substrate 102 creates the bottom source drain near the channel 111 and forms the junction. The bottom source drain 110 is the substrate material doped with some of the p-type dopants that moved from the source drain epitaxy 108. The bottom source drain 110 is positioned laterally adjacent to the source drain epitaxy 108. Once the bottom source drain 110 is formed, the remaining portion of the substrate above the bottom source drain 110 may be referred to as a channel 111. The channel 111 is made of the same material as the substrate 102.

In an embodiment, the structure 100 may also include a shallow trench isolation (STI) (not shown) between the two fins 200. The STI may be formed in many ways. In an embodiment, a single etching process, or multiple etching processes, may also be performed to remove, between the two fins 200, portions of the source drain epitaxy 108, and the substrate 102. The resulting trench (not illustrated) may extend from the top surface of the source drain epitaxy 108 through a portion of the substrate 102. The trench is then filled with a dielectric material forming the STI 136. The STI 136 is a form of a dielectric plug that separates the two fins 200 such that electrical current applied to one fin has no effect on the second fin. Typically, the STI 136 extends through a portion of the substrate 102 to a depth that allows for the two fins to be electrically separated.

Figure 5:
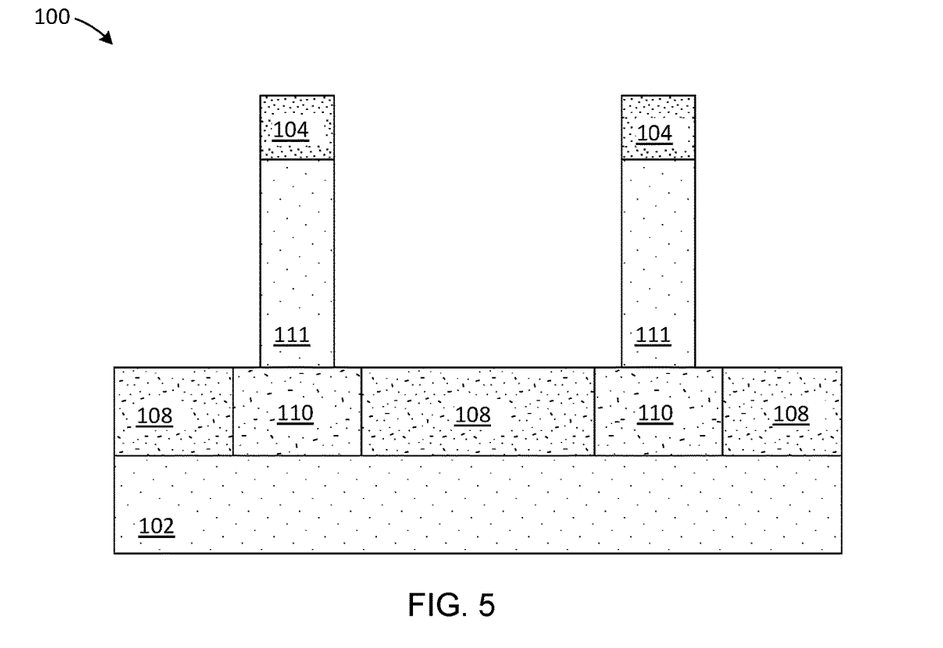
FIG. 5 is a cross section view illustrating removing the spacers in accordance with an exemplary embodiment.

Referring now to FIG. 5, the structure 100 with the sidewall spacers 106 removed is shown, in accordance with an embodiment. After the bottom source drain 110 is formed, the sidewall spacers 106 are removed from the sidewalls of the fins 200, thereby exposing the sidewalls of the fins 200. The sidewall spacers 106 may be etched using a process that is selective to (will not substantially remove) the hard mask cap 104, the substrate 102, the source drain epitaxy 108, or the bottom source drain 110.

Figure 6:
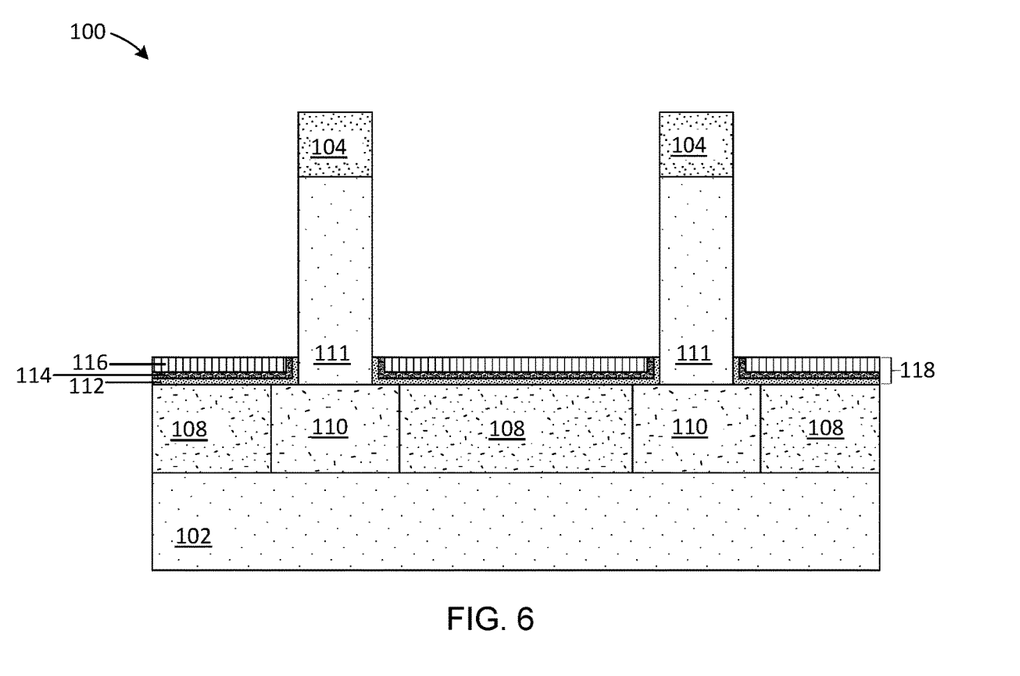
FIG. 6 is a cross section view illustrating forming a bottom spacer with a bi-layer dipole liner according to an exemplary embodiment.

Referring now to FIG. 6, the structure 100 with a bottom spacer 118 is shown, in accordance with an embodiment. The bottom spacer 118 may include a first layer 112, a second layer 114, and a dielectric 116. The first layer 112 may be made of material such as, for example, silicon oxide. The second layer 114 may be made of different materials, depending on whether the wimpy device is a p-type vertical transistor or an n-type vertical transistor. For p-type vertical transistors, the second layer 114 may be made of silicon nitride, whereas, for n-type vertical transistors, the second layer 114 may be made of aluminum oxide. The first and second layers 112, 114 may collectively be called a bi-layer dipole liner. The first layer 112 in combination with the second layer 114 is necessary in order to make the bi-layer dipole liner work. The dielectric 116 may be made of low-k dielectric material (with k<4.0), including but not limited to, silicon oxide.

In order to form the bottom spacer 118, the first layer 112 is conformally deposited, using known deposition techniques, onto the top surface of the structure 100. The second layer 114 is then conformally deposited, using known deposition techniques, onto the top surface of the first layer 112. The first and second layers 112, 114 are deposited to a thickness between 1-2 nm. The thickness of the first and second layers 112, 114 may have an effect on the electric field and as a result on the threshold voltage. As such, the thicker the bi-layer dipole liner, the greater the range in threshold voltage. A thickness between 1-2 nm may modulate the threshold voltage for <50 mV range. Once the first and second layers 112, 114 are deposited, the dielectric 116 is then deposited onto the top surface of the second layer 114.

An etch process that is selective to (will not substantially remove) the first and second layers 112, 114 may be used to remove the dielectric 116 from the top surface of the hard mask cap 104 and the sidewalls of the fins 200. The etch process may be, for example, a reactive ion etch. Another etch process may be used to then etch back the first and second layers 112, 114 from the top surface of the hard mask cap 104 and the sidewalls of the fins 200. The resultant structure 100, as illustrated in FIG. 6, includes the bottom spacer 118 that is formed along the top surfaces of the source drain epitaxy 108 and the bottom source drain 110.

Typically, a standard vertical transistor may include a bottom spacer that is made of low-k material such as, for example, silicon oxide. Embodiments of the present invention disclose a bottom spacer 118 that includes a bi-layer dipole liner and the dielectric 116, where the dielectric 116 is made of low-k material. The combination of the dipole liner with the dielectric 116 creates a wimpy vertical transistor due to a longer effective gate length when compared to a gate length of a standard vertical transistor. Further, for a wimpy n-type vertical transistor, the dipole liner is made of silicon oxide (the first layer 112) and aluminum oxide (the second layer 114) and generates a negative charge close to the fin 200. For a wimpy p-type vertical transistor, the dipole liner is made of silicon oxide (the first layer 112) and silicon nitride (the second layer 114) and generates a positive charge close to the fin 200.

Figure 7:
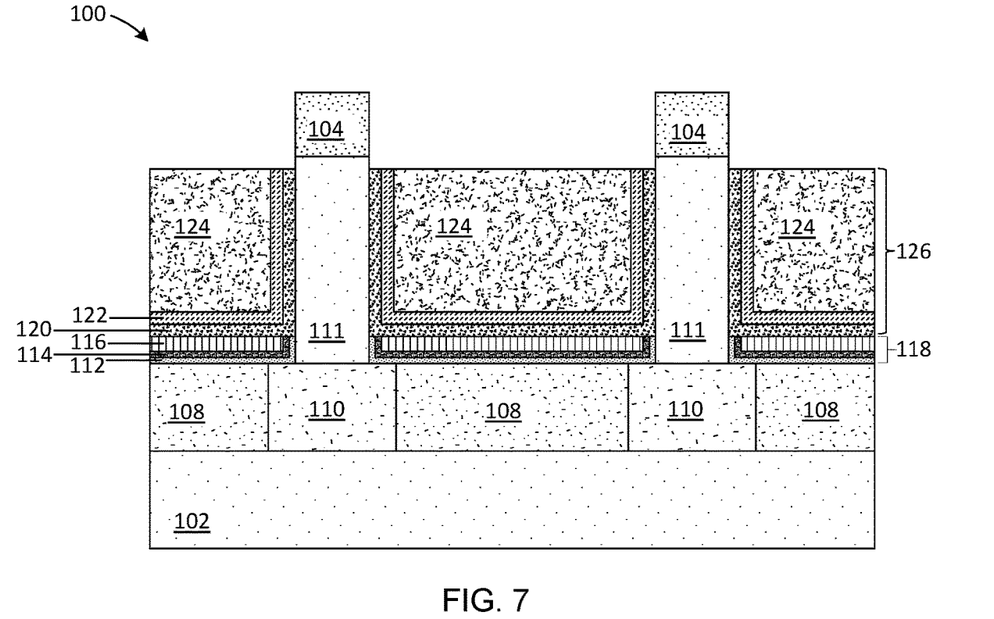
FIG. 7 is a cross section view illustrating depositing a gate dielectric material, a work function metal, and a metal gate according to an exemplary embodiment.

Referring now to FIG. 7, the structure 100 with a gate stack 126 is shown, in accordance with an embodiment. The gate stack 126 may include a gate dielectric material 120, a work function metal, and a metal gate 124.

Once the bottom spacer 118 is formed, the gate dielectric material 120 is conformally deposited onto the top surface of the structure 100. The work function metal 122 is then conformally deposited onto the top portions of the gate dielectric material 120. The gate dielectric material 120 and the work function metal 122 are disposed on the bottom spacer 118, the sidewalls of the fins 200, and the hard mask caps 104.

The gate dielectric material 120 can be a dielectric material having a dielectric constant greater than 3.9, 7.0, or 10.0. Non-limiting examples of suitable materials for the gate dielectric material 120 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 120 separates the sidewalls of the fins 200 from the work function metal 122, reducing the leakage current effect while increasing the capacitance of the work function metal 122. The gate dielectric material 120 layer may be formed by suitable deposition processes, for example, chemical vapor deposition, plasma-enhanced chemical vapor deposition, atomic layer deposition evaporation, physical vapor deposition, chemical solution deposition, or other like processes. The thickness of the gate dielectric material 120 may vary depending on the deposition process as well as the composition and number of high-k dielectric materials used.

The work function metal 122 may be disposed over the gate dielectric material 120. The type of work function metal 122 depends on the type of a transistor. Non-limiting examples of suitable work function metal 122 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal 122 may be deposited by a suitable deposition process, for example, chemical vapor deposition, plasma-enhanced chemical vapor deposition, physical vapor deposition, plating, thermal or e-beam evaporation, and sputtering.

Once the gate dielectric material 120 and the work function metal 122 are conformally deposited on the structure 100, the structure 100 is filled with a metal to form the metal gate 124. The structure 100 is filled with the metal such that top surface of the metal gate 124 is right below the top surface of the fin 200. The metal gate 124 is deposited over the gate dielectric material 120 and work function metal 122. The metal gate 124, the work function metal 122, and the gate dielectric material 120 may be collectively referred to as the gate stack 126. Non-limiting examples of the metal gate 124 may include aluminum (Al), platinum (Pt), gold (Au), tungsten (W), titanium (Ti), or any combination thereof. The conductive metal may be deposited by a suitable deposition process, for example, chemical vapor deposition, plasma-enhanced chemical vapor deposition, physical vapor deposition, plating, thermal or e-beam evaporation, and sputtering.

With continued reference to FIG. 7, once the metal gate 124 is deposited, the structure 100 undergoes an etch process to remove the gate dielectric material 120 and the work function metal 122 from the top surface and the sidewalls of the hard mask cap 104. The etch process may be selective to (will not substantially remove) the metal gate 124. The etch process may be, for example, a reactive ion etch. After the etch process is performed, the top surfaces of the gate dielectric material 120 and the work function metal 122 are substantially flush with the top surface of the metal gate 124. In addition, the top surfaces of the gate dielectric material 120, the work function metal 122, and the metal gate 124 are below the top surface of the fins 200.

Figure 8:
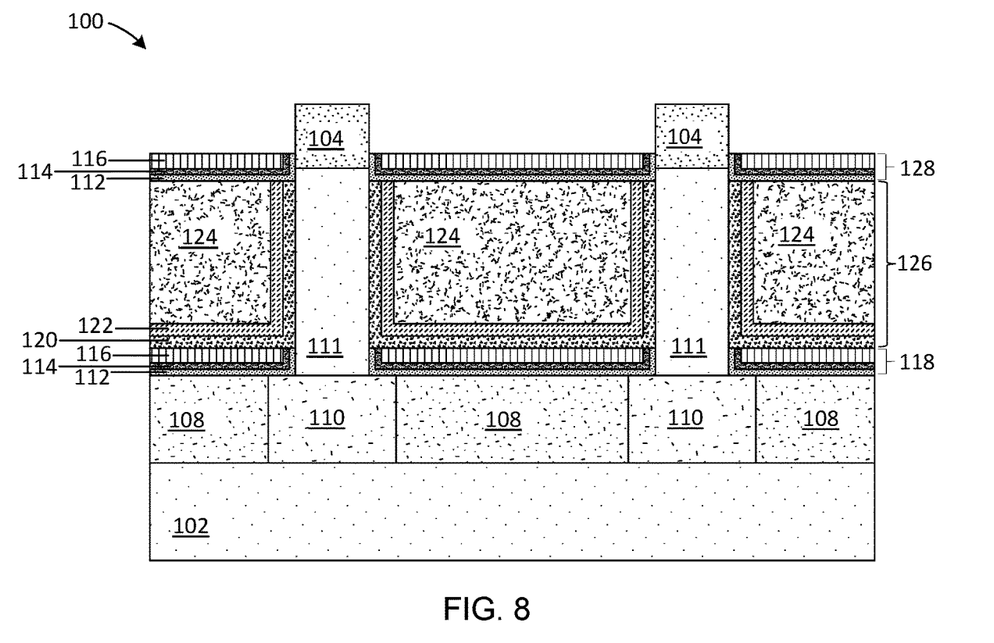
FIG. 8 is a cross section view illustrating forming a top spacer with a bi-layer dipole liner according to an exemplary embodiment.

Referring now to FIG. 8, the structure 100 with a top spacer 128 is shown, in accordance with an embodiment. The top spacer 128 is substantially identical to the bottom spacer 118 and includes the first layer 112, the second layer 114, and the dielectric 116. The top spacer 128 may be formed by first conformally depositing the first layer 112 onto the top surface of the structure 100 such that the first layer 112 is in direct contact with the gate dielectric material 120, the work function metal 122, the metal gate 124, the fins 200, and the hard mask cap 104. The second layer 114 is then conformally deposited, using known deposition techniques, onto the top surface of the first layer 112. The first and second layers 112, 114 are deposited to a thickness between 1-2 nm. Once the first and second layers 112, 114 are deposited, the dielectric 116 is then deposited onto the top surface of the second layer 114.

The top spacer 128 may be formed by the same processes that are used to form the bottom spacer 118, as described herein with reference to FIG. 6. The resultant structure 100, as illustrated in FIG. 8, includes the top spacer 128 that is formed along the top surfaces of the gate dielectric material 120, the work function metal 122, and the metal gate 124. The top spacer 128 is laterally positioned adjacent to an interface where the top surfaces of the fins 200 are in direct contact with the bottom surfaces of the hard mask caps 104. Like the bottom spacer 118, the top spacer 128 also includes the first layer 112, the second layer 114, and the dielectric 116.

Figure 9:
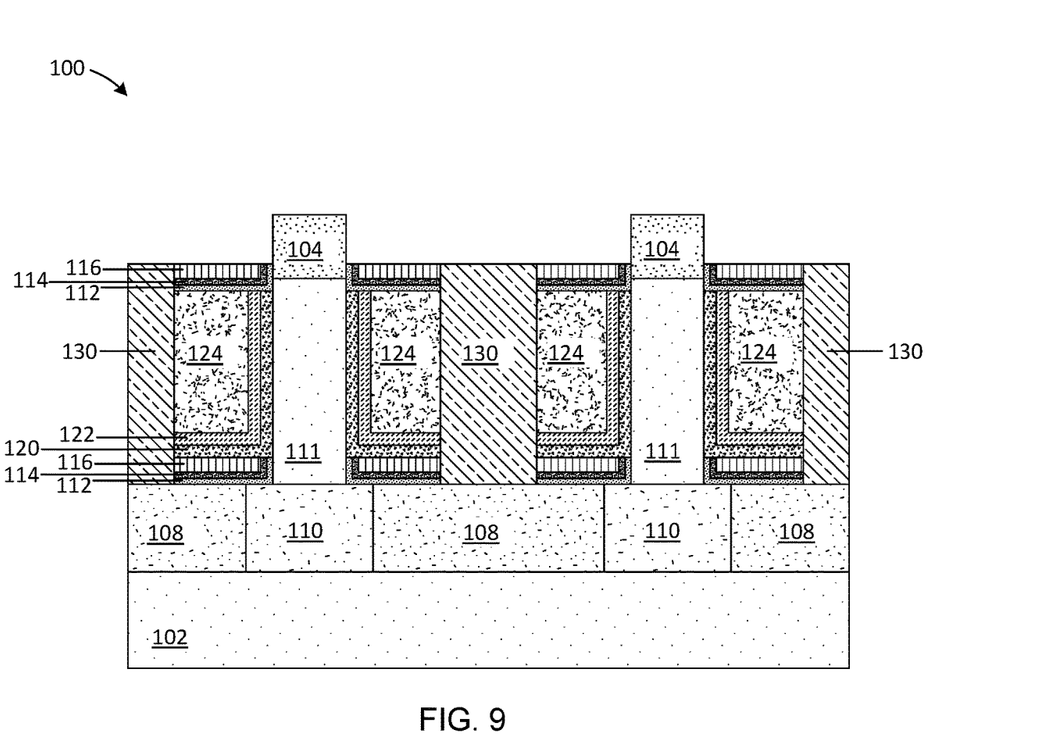
FIG. 9 is a cross section view illustrating removing a portion of the top spacer, the metal gate, and the bottom spacer and filling the resultant opening with an interlayer dielectric according to an exemplary embodiment.

Referring now to FIG. 9, the structure 100 with an interlayer dielectric (ILD) 130 is shown, in accordance with an embodiment. The structure 100 undergoes an etch process where a portion of the top spacer 128, a portion of the metal gate 124, a portion of the work function metal 122, a portion of the gate dielectric material 120, and a portion of the bottom spacer 118 are removed to form a trench and expose the top surface of the source drain epitaxy 108. A mask may first be disposed on the exposed top surface of the top spacer 128 and subsequently patterned. The pattern is transferred into the top spacer 128 to remove a portion of the top spacer 128 to expose a top surface of the metal gate 124. The same process may be subsequently performed to remove a portion of the metal gate 124, a portion of the work function metal 122, a portion of the gate dielectric material 120, and a portion of the bottom spacer 118 are removed to expose the top surface of the source drain epitaxy 108.

Once a portion of the top surface of the source drain epitaxy 108 is exposed, the ILD 130 is deposited such that top surface of the ILD 130 is substantially flush with the top surfaces of top spacer 128. The ILD 130 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 130 is deposited by a deposition process, including, but not limited to chemical vapor deposition, physical vapor deposition, plasma enhanced chemical vapor deposition, atomic layer deposition, evaporation, chemical solution deposition, or like processes.

Figure 10:
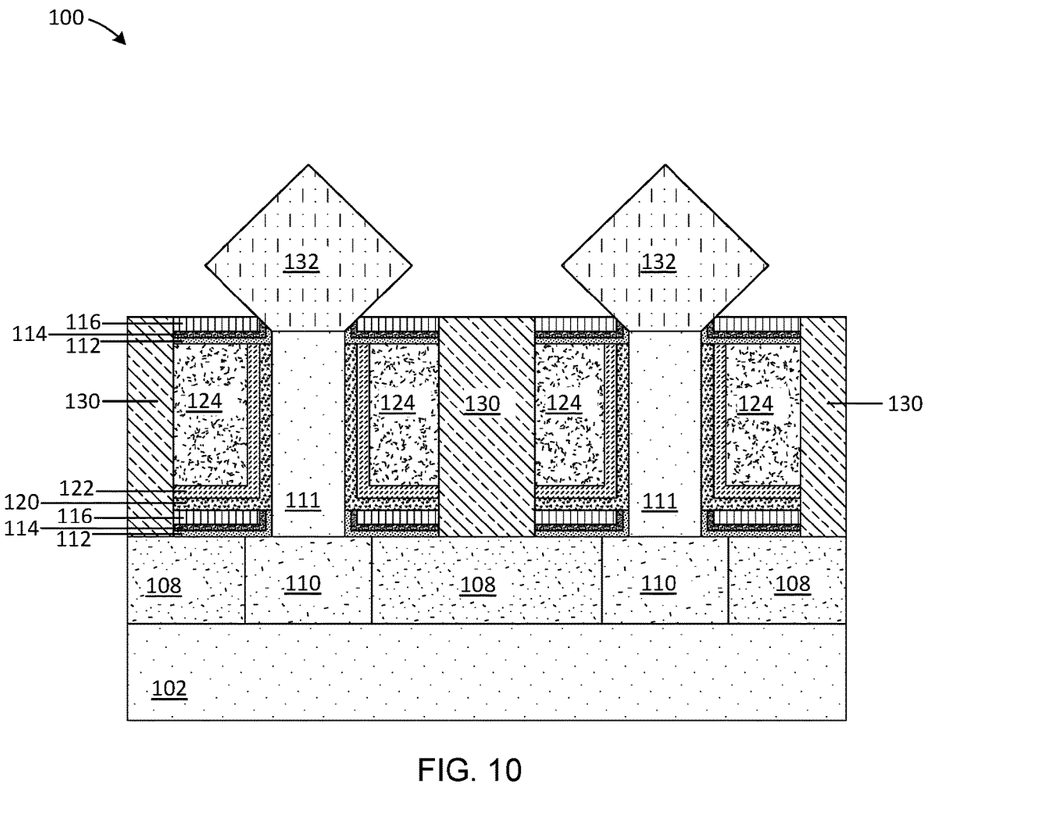
FIG. 10 is a cross section view illustrating forming top source drain according to an exemplary embodiment.

Referring now to FIG. 10, the structure 100 with top source drains 132 is shown, in accordance with an embodiment. To form the top source drains 132, the hard mask caps 104, illustrated in FIGS. 1-9, is first removed. The hard mask caps 104 may be removed by utilizing any material removal process, such as, for example, chemical mechanical polishing. Once the hard mask caps 104 are removed, exposing the top surfaces of the fins 200, the top source drains 132 are epitaxially grown from the exposed top surfaces of the fins 200. The top source drains 132 are the facetted epitaxy source drain region of the vertical transistor. The faceted top source drain 132 grows in a shape of pointed cones, wherein the points of the top source drain 132 extend horizontally and vertically away from the fins 200. The pointed cone shape of the top source drain 132 enhances the electric field at the tip of the cone.

The top source drain 132 may be grown using epitaxial growth processes, such as, for example molecular beam epitaxy. Other method such as rapid thermal chemical vapor deposition, low-energy plasma deposition, ultra-high vacuum chemical vapor deposition, atmospheric pressure chemical vapor deposition may also be used to grow the top source drain 132. The temperature for epitaxial deposition typically ranges from 450° C. to 900° C. Although higher temperature typically results in faster deposition, the faster deposition may result in crystal defects and film cracking.

Figure 11:
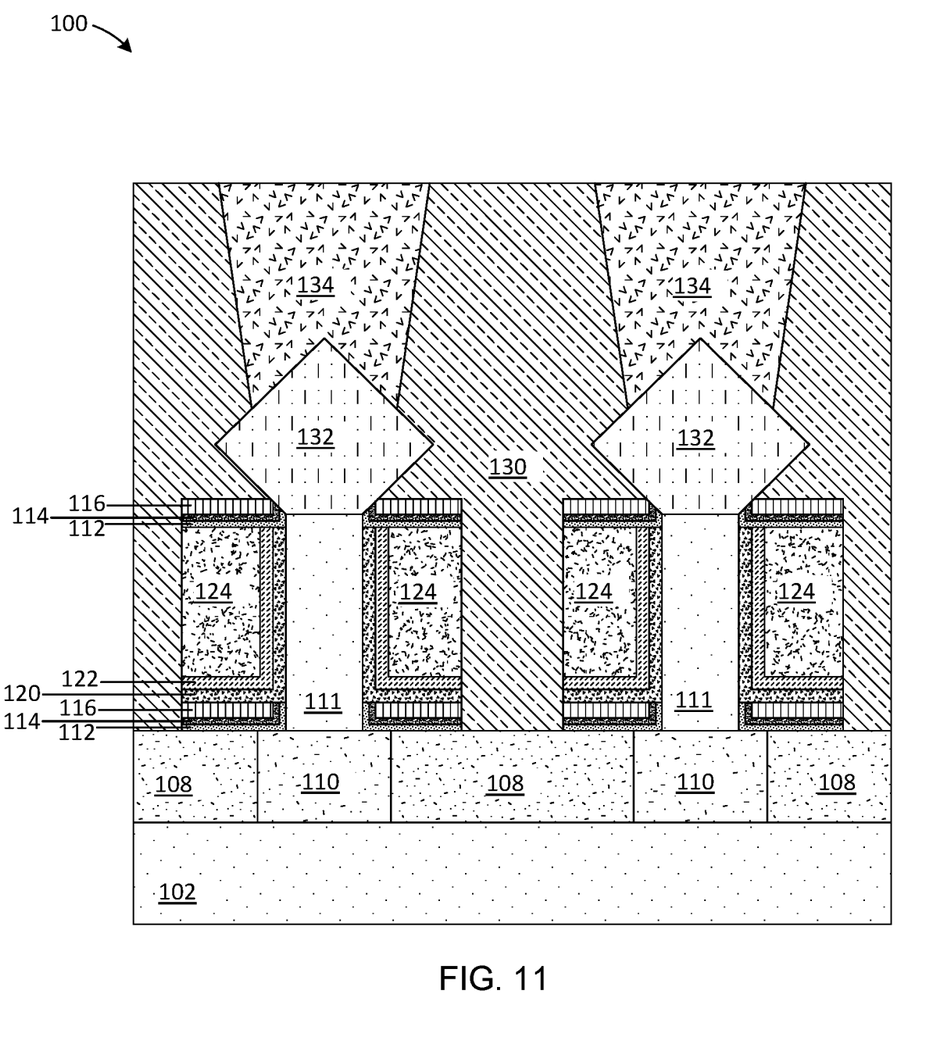
FIG. 11 is a cross section view illustrating forming the interlayer dielectric and contacts according to an exemplary embodiment.

Referring now to FIG. 11, the structure 100 with contacts 134 is shown, in accordance with an embodiment. Once the top source drains 132 are formed, the structure 100 is filled with the ILD 130, covering the top source drains 132. Next, contacts 134 are formed. The contacts 134 extend through the ILD 130 to the top source drains 132 and are formed within a trench. To remove the ILD 130 and form the contact trenches, a resist, such as a photoresist, may be deposited and patterned. An etch process, such as reactive ion etch, may be performed using the patterned resist as an etch mask to remove the ILD 130 until the top source drains 132 are exposed. The contact trenches are filled with a conductive material or a combination of conductive materials to form the contacts 134. The conductive material filling may be a conductive metal, for example, aluminum (Al), platinum (Pt), gold (Au), tungsten (W), titanium (Ti), or any combination thereof. The conductive material may be deposited by a suitable deposition process, for example, chemical vapor deposition, plasma enhanced chemical vapor deposition, physical vapor deposition, plating, thermal or e-beam evaporation, or sputtering. A planarization process, for example, chemical mechanical planarization, is performed to remove any conductive material from the surface of the ILD 130.

The resultant structure 100, as illustrated in FIG. 11, includes two wimpy vertical transistors. It should be appreciated that even though two wimpy vertical transistors are illustrated, embodiments of the present invention contemplate forming a plurality of wimpy vertical transistors on a single substrate wafer.

Each of the vertical transistors, illustrated in FIG. 11, includes a dipole liner. The dipole liner is made of the first and second layers 112, 114. In addition to the dipole liner, the vertical transistors also include the dielectric 116. The dipole liner and the dielectric 116 form the bottom and top spacers 118, 128. Further, the combination of the dipole liner with the dielectric creates a vertical transistor that is wimpy due to a longer effective gate length when compared to a gate length of a standard vertical transistor. The first layer 112 of the dipole liner may be made of material such as, for example, silicon oxide. The gate dielectric material 120 may also be made of an oxide material. Further, the gate dielectric material 120 acts as a barrier, separating the sidewalls of the fins 200 from the work function metal 122, reducing the leakage current effect while increasing the capacitance of the work function metal 122. Since the first layer 112 may be made of the same material as the gate dielectric material 120, the first layer 112 may also act as a barrier, reducing the leakage current effect and increasing the effective gate length of the vertical transistor.

Figure 12:
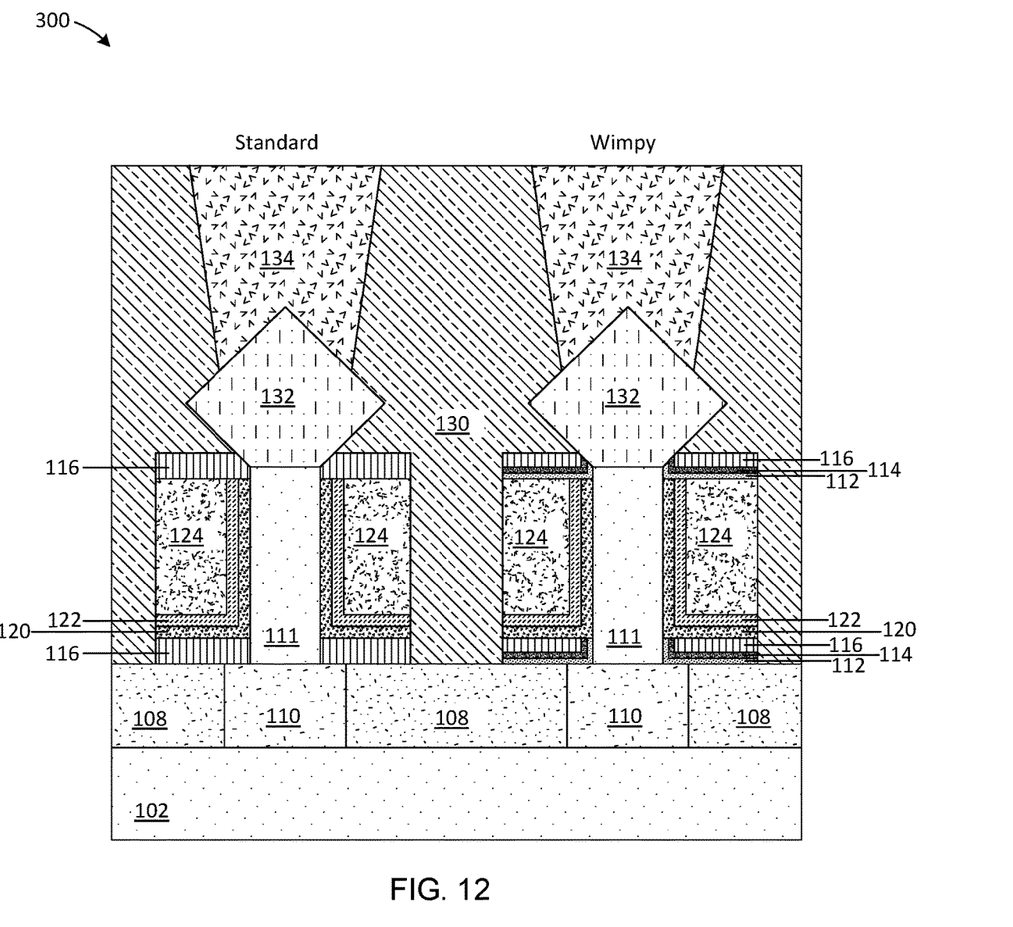
FIG. 12 is a cross section view illustrating a standard vertical transport field effect transistor and a wimpy vertical transport field effect transistor according to an exemplary embodiment.

Referring now to FIG. 12, a structure 300 with a standard vertical transistor and a wimpy vertical transistor is shown, in accordance with an embodiment. The wimpy vertical transistor may include the gate stack 126 located between the bottom and top source drains 108, 132. The gate stack may include the gate dielectric material 120, the work function metal 122, and the metal gate 124. Further, the bottom and top spacers 108, 128 are made of the dipole liner and the dielectric 116.

The standard vertical transistor includes the gate stack 126 that is formed by the gate dielectric material 120, the work function metal 122, and the metal gate 124. The standard vertical transistor also includes the bottom and top source drains 108, 132 and the bottom and top spacers. However, the bottom and top spacers in the standard vertical transistor are made of the dielectric 116 only. The bottom and top spacers in the standard vertical transistor do not include the dipole liner. As a result, the standard vertical transistor is not wimpy. Nevertheless, the standard vertical transistor may be fabricated side by side with the wimpy vertical transistor. For example, during the formation of the bottom and top spacers, the first and second layers 112, 144 as well as the dielectric 116 are deposited to form the wimpy vertical transistor, whereas, only the dielectric 116 is deposited to form the standard vertical transistor. During the deposition of the first and second layers 112, 114, the standard vertical transistor may be masked so that the first and second layers 112, 114 are deposited only onto the structure that would form the wimpy vertical transistor. In addition, the actual physical gate length is the same for the standard vertical transistor and the wimpy vertical transistor. However, the effective gate length is longer in the wimpy vertical transistor than in the standard vertical transistor because of the dipole liner. The dipole liner has an effect on the electric field near the source drain regions of the vertical transistors thus creating a threshold voltage difference.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a bottom source drain, a top source drain, and a gate stack, wherein the top source drain is above the gate stack and the bottom source drain is below the gate stack;
    a bottom spacer and a top spacer, wherein the gate stack is between the bottom spacer and the top spacer, wherein the bottom spacer and the top spacer each comprise a dipole liner, wherein the bottom spacer comprises a dielectric in direct contact with the dipole liner.

2. The semiconductor structure of claim 1, wherein the dipole liner comprises:
    a first layer; and
    a second layer, wherein the second layer is in direct contact with the first layer, wherein the second layer is made of different material than the first layer.

3. The semiconductor structure of claim 1, wherein the first layer is made of silicon oxide.

4. The semiconductor structure of claim 1, wherein the second layer is made of silicon nitride.

5. The semiconductor structure of claim 1, wherein the dipole liner of the bottom spacer is in direct contact with both the gate stack and the bottom source drain, and the dipole liner of the top spacer is in direct contact with both the gate stack and the top source drain.

6. A semiconductor structure comprising:
    a vertical field effect transistor comprising a top source drain, a bottom source drain, a bottom spacer, a top spacer, and a gate stack, wherein the bottom source drain is separated from the gate stack by the bottom spacer, the bottom spacer comprising a dielectric in direct contact with a dipole liner, the dipole liner contacting the bottom source drain.

7. The semiconductor structure of claim 6, wherein the top source drain is separated from the gate stack by the top spacer, the top spacer comprising the dipole liner, the dipole liner contacting the top source drain.

8. The semiconductor structure of claim 6, wherein the dipole liner comprises:
    a first layer; and
    a second layer, wherein the second layer is in direct contact with the first layer, wherein the second layer is made of different material than the first layer.

9. The semiconductor structure of claim 6, wherein the first layer is made of silicon oxide.

10. The semiconductor structure of claim 6, wherein the second layer is made of silicon nitride.

11. The semiconductor structure of claim 6, wherein the dipole liner of the bottom spacer is in direct contact with both the gate stack and the bottom source drain, and the dipole liner of the top spacer is in direct contact with both the gate stack and the top source drain.

12. A semiconductor structure comprising:
    a bottom source drain, a top source drain, and a gate stack, wherein the top source drain is above the gate stack and the bottom source drain is below the gate stack;
    a bottom spacer and a top spacer, wherein the gate stack is between the bottom spacer and the top spacer, wherein the bottom spacer and the top spacer each comprise a dipole liner, wherein the dipole liner comprises:
    a first layer; and
    a second layer in direct contact with the first layer, wherein the second layer is made of different material than the first layer, and wherein the second layer is made of aluminum oxide.

13. The semiconductor structure of claim 12, wherein the first layer is made of silicon oxide.

14. The semiconductor structure of claim 12, the first layer of the dipole liner of the bottom spacer is in direct contact with both the gate stack and the bottom source drain, and the first layer of the dipole liner of the top spacer is in direct contact with both the gate stack and the top source drain.

15. The semiconductor structure of claim 12, further comprising:
    a channel, wherein the first layer of the dipole liner of the bottom spacer is in direct contact with the channel, and the first layer of the dipole liner of the top spacer is in direct contact with the channel.

16. A semiconductor structure comprising:
    a vertical field effect transistor comprising a top source drain, a bottom source drain, a bottom spacer, a top spacer, and a gate stack, wherein the bottom source drain is separated from the gate stack by the bottom spacer, the bottom spacer comprising a dipole liner contacting the bottom source drain, wherein the dipole liner comprises:
    a first layer; and
    a second layer in direct contact with the first layer, wherein the second layer is made of different material than the first layer, and wherein the second layer is made of aluminum oxide.

17. The semiconductor structure of claim 16, wherein the top source drain is separated from the gate stack by the top spacer, the top spacer comprising the dipole liner, the dipole liner contacting the top source drain.

18. The semiconductor structure of claim 16, wherein the first layer is made of silicon oxide.

19. The semiconductor structure of claim 16, further comprising:
    a channel, wherein the first layer of the dipole liner of the bottom spacer is in direct contact with the channel, and the first layer of the dipole liner of the top spacer is in direct contact with the channel.

* * * * *